(12) United States Patent
Watkins

(10) Patent No.: US 6,317,027 B1
(45) Date of Patent: *Nov. 13, 2001

(54) AUTO-TUNNING SCANNING PROXIMITY READER

(76) Inventor: Randy Watkins, 21011 Chatsworth St., Chatsworth, CA (US) 91311

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/229,146

(22) Filed: Jan. 12, 1999

(51) Int. Cl.[7] .................................................. G08B 13/184
(52) U.S. Cl. ...................... 340/10.1; 340/10.3; 340/572.4
(58) Field of Search .................... 340/10.1, 10.3, 340/10.33, 10.34, 572.1, 572.3, 572.4, 572.5; 342/42; 343/745, 703; 455/103, 104, 106, 107, 120, 121, 123, 77; 333/17.3; 375/344

(56) References Cited

U.S. PATENT DOCUMENTS

| | | |
|---|---|---|
| 3,713,148 | 1/1973 | Cardullo et al. . |
| 4,201,960 * | 5/1980 | Skutta ................................. 333/17.3 |
| 4,356,477 * | 10/1982 | Vandebult .......................... 340/572.4 |
| 4,480,178 | 10/1984 | Miller, II et al. . |
| 5,025,492 | 6/1991 | Viereck . |
| 5,053,774 | 10/1991 | Schuermann et al. . |
| 5,270,717 | 12/1993 | Schuermann . |
| 5,347,280 | 9/1994 | Schuermann . |
| 5,353,011 * | 10/1994 | Wheeler ............................ 340/572.4 |
| 5,374,930 | 12/1994 | Schuermann . |
| 5,396,251 | 3/1995 | Schuermann . |
| 5,491,484 | 2/1996 | Schuermann . |
| 5,491,715 | 2/1996 | Flaxl . |
| 5,541,604 | 7/1996 | Meier . |
| 5,568,512 | 10/1996 | Rotzoll . |
| 5,583,819 | 12/1996 | Roesner et al. . |
| 5,815,355 | 9/1998 | Dawes . |
| 5,856,809 * | 1/1999 | Schoepfer ............................ 343/703 |

* cited by examiner

Primary Examiner—Edwin C. Holloway, III
(74) Attorney, Agent, or Firm—Natan Epstein; Beehler & Pavitt

(57) ABSTRACT

A proximity reader for a radio frequency identification (RFID) system is programmed for determining and storing optimum antenna impedance values to achieve peak antenna resonance at each of multiple operating frequencies. Antenna resonance is peaked at power up and periodically during operation to compensate for environmental detuning influences. The reader scans the multiple frequencies to more effectively search for off-frequency identification tags.

19 Claims, 3 Drawing Sheets

AUTO-TUNNING SCANNING PROXIMITY READER

BACKGROUND OF THE INVENTION

1. Field of the Invention

This invention relates to the field of radio-frequency identification systems (RFID) and in particular concerns improvements in RFID proximity readers.

2. State of the Prior Art

Radio-frequency identification (RFID) systems include passive systems in which the ID tag circuits are powered by energy radiated by the reader, and active tags which carry a battery. Passive ID systems tend to have a shorter operating range because actuation of the ID tags requires a sufficient RF field strength from the reader. Typical passive proximity readers have a relatively short range of operation, about two feet or less between reader and ID tag. Operating range is often an important criterion in the selection of a proximity system, and it is generally desirable to detect ID tags at somewhat greater range, such as five feet away, for greater flexibility in positioning of the reader unit or to cover a wider area with a single reader.

The reader in a passive ID system has an RF frequency generator and a tuned antenna circuit which establish a radio frequency field near the reader unit. The passive ID tags lack a frequency generator and instead communicate with the reader by loading down the reader's radiated field in a pattern which is detected by the reader and decoded as ID tag data. The ID tag includes a transponder integrated circuit which is powered by energy derived from the reader's RF field. The energy required by the tag transponder is received by means of a tag antenna circuit tuned to peak resonance at the reader's transmission frequency. The effective operating range of the reader/ID tag system is determined in part by the efficiency with which the RF energy is radiated by the reader and received by the tag. This calls for accurate tuning of the resonant antenna circuits of both tag and reader. In practice, however, environmental factors and manufacturing tolerances result in a departure from this ideal.

In existing passive proximity identification systems both reader and identification tags are intended to operate on a single common radio frequency, typically 125 kHz. Metallic and dielectric materials in the vicinity of the reader, and changes in temperature and humidity may all affect the tuning of the antenna circuits in the reader, resulting in less than optimal radiation of the RF field and reduced power transfer from the reader to the tags. That is, for I.D. tags of given sensitivity, the tag must be brought closer to the reader before the tag transponder will be activated by the reader's weakened transmission. The tuned antenna circuit of the tags is similarly affected by environmental factors and also by manufacturing tolerances, both of which may degrade tag performance by shifting the peak resonance of the tag away from the reader's operating frequency. If the tag tuning is off frequency, the operating range of the proximity system is again reduced because of diminished tag sensitivity and reduced loading of the reader's RF field. Tag performance can be improved by using high precision components, but such precision is costly. Five percent tolerance parts are much cheaper than one percent components, and ten percent tolerance parts are cheaper still. Since ID tags are often used in large numbers, it is desirable to keep the unit cost of the tags as low as possible.

In order to accommodate off-frequency drift in both the proximity reader and the ID tags, current practice is to use low-Q antenna circuits in the reader. Low-Q resonant tank circuits have a broader frequency response but at the expense of lowered sensitivity at the center frequency of the antenna circuits. The broader response allows the reader to detect off-frequency tags but at a lower level of system performance, that is, with lower sensitivity so that the tags must be closer to the reader before being detected.

A continuing need exists for more effective proximity readers capable of detecting passive ID tags at greater range and in particular more reliably detecting off-frequency ID tags.

SUMMARY OF THE INVENTION

This invention addresses the aforementioned need by providing an improved proximity reader with auto-tuning capability for negating environmental influences on the tuning of the reader antenna circuit, and frequency scanning capability for improved detection of off-frequency ID tags. The improved reader may use high-Q antenna circuits for greater sensitivity without excluding off-frequency tags. A relatively wide range of frequencies can be scanned at higher sensitivity over the scanned range than was possible with broadband low-Q antenna circuits, resulting in markedly improved overall system performance.

According to this invention a proximity reader for a radio frequency identification system has a frequency generator for generating a center frequency and a number of side frequencies, an antenna circuit connected for radiating the center frequency and side frequencies to interrogate transponder tags, a microprocessor connected to the antenna circuit for receiving and decoding transponder tag information, an antenna resonance tuner circuit including a selectable tuning impedance in the antenna circuit, and a tuner program operative for selecting values of the tuning impedance to substantially optimize the reactance of the antenna circuit at each of the center and side frequencies. The selected values are stored in memory for reference by a frequency scanning program. The selectable impedance may include a number of binarily weighted capacitances addressable by the microprocessor, and the impedance values may be stored as a table of addresses accessible by the microprocessor under control of the scanner program for switching the selected capacitances into the antenna circuit. Preferably the tuner program is executed upon initial power-up of the reader and periodically thereafter to regularly sense and compensate for any changes in peak resonance of the antenna circuit due to environmental factors.

The frequency scanning program is operative for executing a frequency scanning sequence including sequentially switching the frequency generator through each of the side and center frequencies thereby to improve interrogation range of off-frequency transponder tags. The side frequencies are selected on either side of the center frequency over a range of frequencies sufficient to include off-frequency ID tags targeted by the proximity identification system. The scanning program is further operative for interrupting the frequency scanning sequence upon detection by the microprocessor of a response from a transponder tag and for resuming the scanning sequence upon completion of the response.

In one form of the invention the frequency generator is a frequency synthesizer based on the crystal controlled clock internal to the microprocessor and including a clock frequency divider controlled by the tuner program means for setting the desired center and side frequencies. In this embodiment the tuner program and scanning program set the desired frequencies of operation by control of frequency synthesis by the microprocessor. Impedance of the antenna circuit is adjusted so as to obtain a resonant peak at each desired frequency of operation, and each desired frequency is stored in memory in association with the antenna impedance value required to achieve peak resonance.

In another form of the invention the antenna resonance tuning circuit comprises a peak detector circuit operative for modifying an output frequency of the frequency generator to obtain a peak resonance of the antenna circuit, and the tuner program is operative for selecting a value of the selectable impedance effective for bringing the output frequency to a desired frequency such that the reactance of the antenna circuit is optimized at the desired frequency. In this embodiment, the microprocessor and tuner program are operative for measuring the output frequency and for storing a value of impedance associated with the desired frequency. The desired frequency may include multiple frequencies, in which case the tuner program is operative for storing a table of impedance values such as capacitance values in the form of switch addresses corresponding to each of the multiple frequencies. The multiple frequencies include the reader's center frequency and side frequencies. The frequency generator and peak detector may be on a common integrated circuit device exterior to the microprocessor.

While it is desirable that the auto-tuning feature and the frequency scanning feature of this invention be both implemented in a particular proximity reader, it is also contemplated that each of these features may be implemented separately since each can make a separate contribution to the performance of the reader unit.

DETAILED DESCRIPTION OF THE PREFERRED EMBODIMENTS

Figure 1:
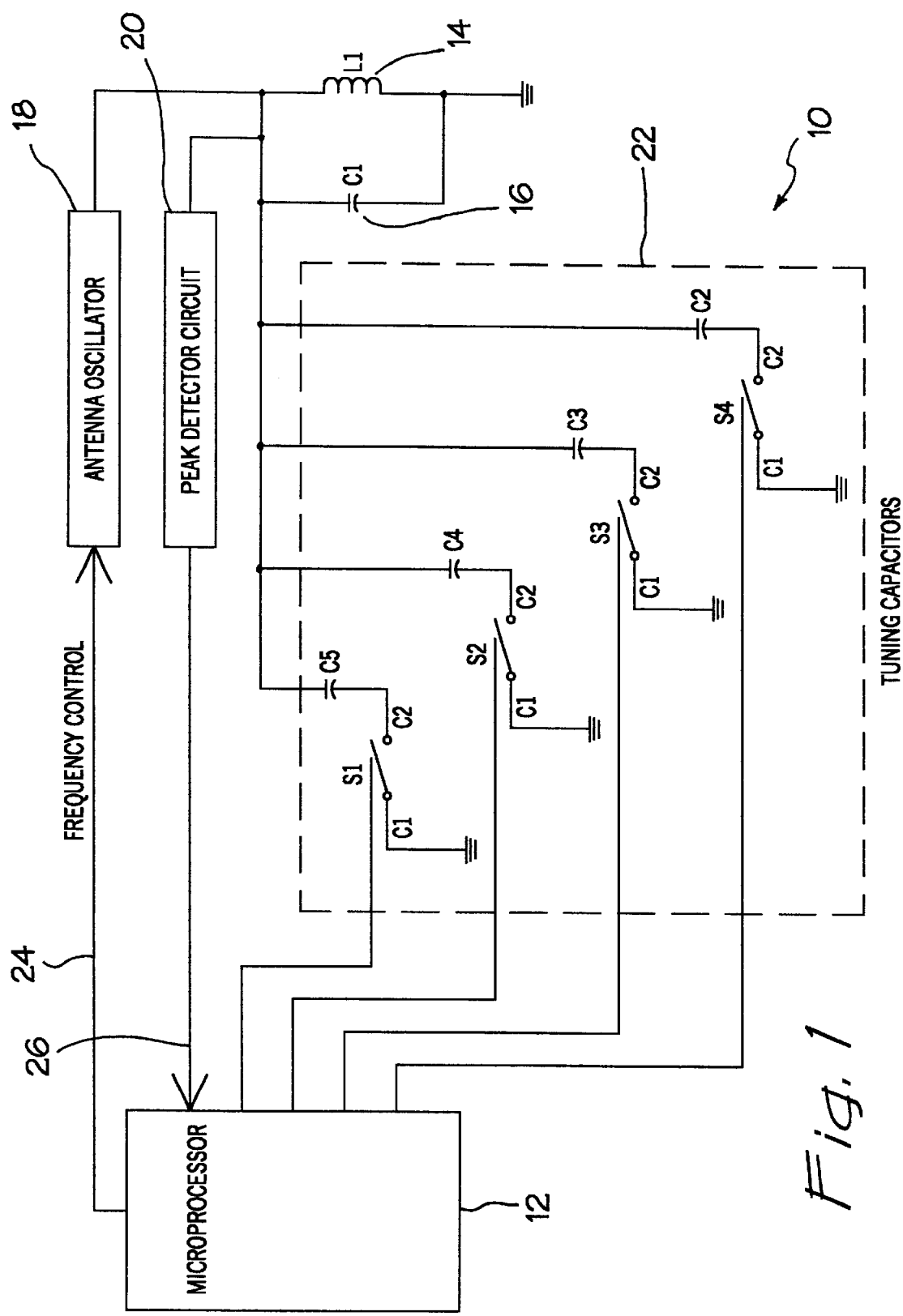
FIG. 1 is a block diagram showing a first design of the improved reader.

With reference to the drawings, FIG. 1 is a schematic block diagram of a proximity reader improved according to a first embodiment of this invention. The reader generally designated by the numeral 10 includes a digital processor 12, an antenna coil 14, a main tuning capacitor 16 connected in parallel with the antenna coil to form a resonant antenna circuit, a frequency generator which includes antenna oscillator 18, and peak detector circuit 20. The radio-frequency is synthesized by processor 12 by dividing down the crystal controlled clock frequency, e.g. 1 MHz, of the processor. This synthesized frequency output is connected via the frequency control line 24 for driving oscillator 18 which operates as a buffer. The output of oscillator 18 drives the antenna tank circuit. Peak detector 20 includes an analog-to-digital converter which converts the peak RF voltage in the antenna circuit to a digital input 26 to processor 12. The RF output frequency is determined by software running on processor 12 and can be shifted under software control as required.

A capacitor ladder 22 includes four supplemental capacitors C1–C4. Each capacitor can be added in parallel to main tuning capacitor 16 by means of corresponding switches S1–S4 individually addressable by processor 12. The values of capacitors C1–C4 are weighed binarily, e.g. in proportion of 1,2,4,8, so that a supplemental capacitance value of from 0 to $15C_x$, for a total of sixteen different capacitance values selectable in increments equal to $C_x$, can be added in parallel to the resonant antenna circuit by closing an appropriate combination of switches S1–S4.

Figure 2:
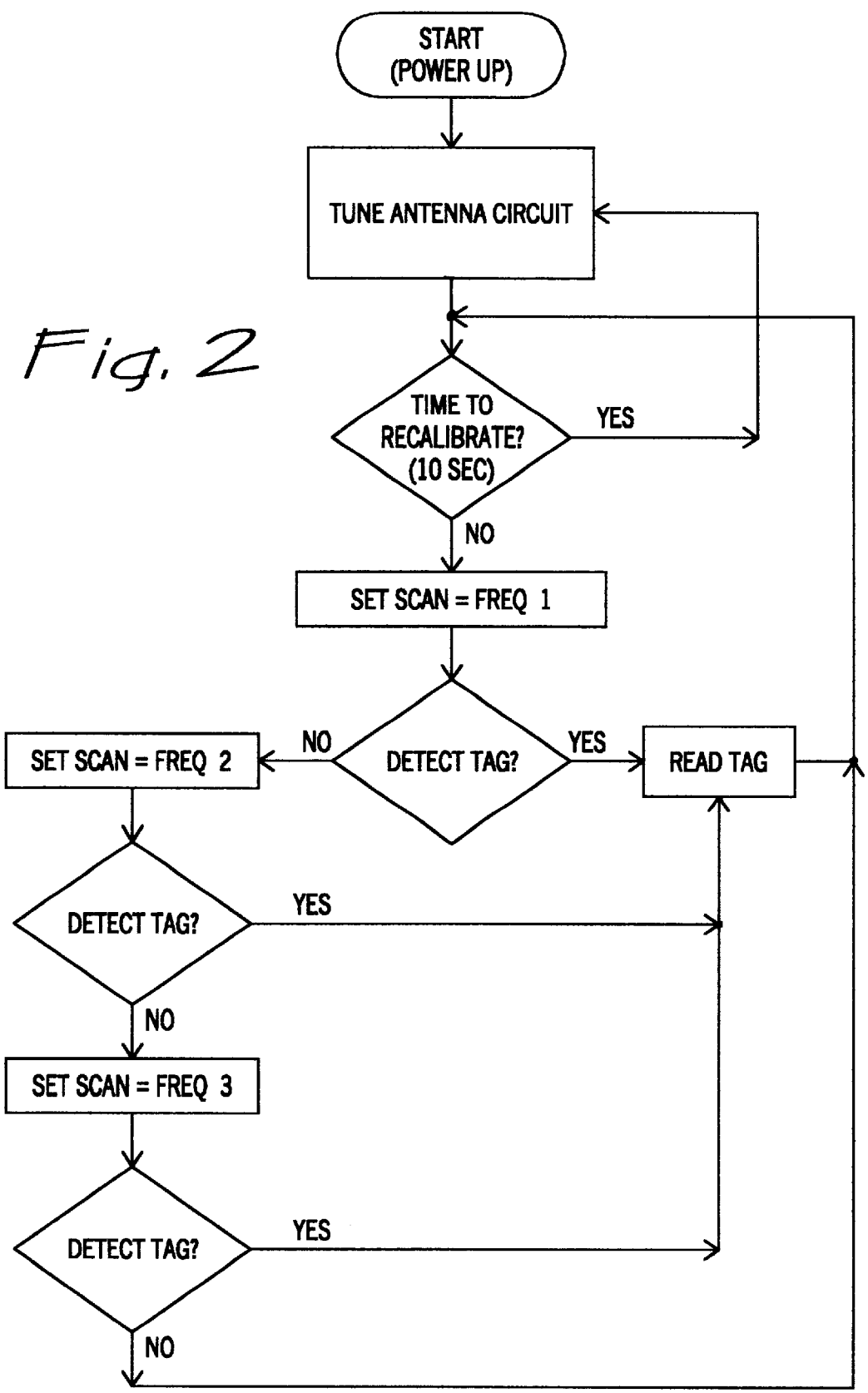
FIG. 2 is a flow chart diagram including the auto-tuning and frequency scanning sequences.

Processor 12 runs under control of stored program instructions including an auto-tuning or tuner program and a frequency scanning program, illustrated by the flow chart of FIG. 2. The auto-tuning program is executed at power up and includes a primary calibration procedure by which the resonant antenna circuit is tuned to peak resonance at the desired main operating frequency of the reader. In this sequence the antenna circuit is tuned for resonance at the desired operating RF frequency, e.g. 125 kHz.

This is a consecutive approximation process in which the capacitance is adjusted to obtain a resonant peak at the current frequency, e.g. 125 kHz . The original values of the antenna coil and main tuning capacitor are chosen so that in an initial condition of the circuit with switches S1–S4 open the peak resonant frequency of the antenna tank circuit is above the desired operating frequency. By then increasing parallel capacitance in the tank circuit the peak resonant frequency is brought down to the desired frequency. This is accomplished by closing suitable combinations of switches S1–S4 under software control by processor 12 in a series of iterations, adding increasing amounts of capacitance until an RF voltage peak is detected at the desired frequency.

The resonance peak is detected by software monitoring the digital output of the A/D converter of peak detector circuit 20. The peak may be detected by measuring increasing RF voltage as capacitance is gradually added followed by a decrease. When the decrease is detected, the amount of capacitance added in the last step before the decrease is subtracted, in effect backing up one step, to restore the antenna circuit to the peak voltage. The antenna circuit is now calibrated for resonance at the main or center operating frequency, thereby maximizing the strength of the reader's RF field at the desired frequency.

A second aspect of the invention seeks to compensate for inaccuracies in the frequency response of the ID tags to be detected by the reader 10. As explained earlier, ID tags have resonant antenna circuits which should peak resonate at the operating frequency of the reader unit for optimum system performance. Off-frequency operation of ID tags may be temporarily caused by transient environmental influences, such as temperature changes or proximity to metallic objects, or may be the permanent result of tolerance error in the components used in the manufacture of the ID tags. Off-frequency tags typically peak at a frequency only slightly removed from the intended operating frequency of the system, and usually are still detectable by the proximity reader running at the intended operating frequency. However, the detection range at which such tags can be read is diminished because the tag's antenna circuit resonates at a frequency other than the reader's transmission frequency. This requires that the tag be brought closer to the reader antenna before sufficient RF field strength is reached to actuate the tag transponder.

To address this problem a frequency scanning program is stored for execution by processor 12. Implementation of the scanning feature entails the selection of a number of side frequencies, which normally will lie at intervals above and below the center operating frequency of the reader. The side frequencies are chosen so as to cover a sufficient frequency range which will include the likely peak frequencies of off-frequency ID tags. The peak frequencies of a tag population usually follow a bell shaped statistical distribution curve. Most tags will be grouped near their intended operating frequency while a diminishing number of tags will fall further from this frequency. So for a standard center frequency of 125 kHz, side frequencies of 121 kHz and 123 kHz may be chosen below the center frequency and side frequencies of 127 kHz and 129 kHz above the center frequency, for a scanned frequency range of 8 kHz. Tags tuned somewhat below 121 kHz and above 129 kHz can also be read with diminished sensitivity, but much better sensitivity than would be the case with a conventional proximity reader operating at the single frequency of 125 kHz. These frequencies are given by way of example only and different frequencies as well as a greater or lesser number of side frequencies may be chosen.

The reader could be operated at multiple frequencies without corresponding adjustment to the tuning of the reader antenna circuit, for example by using a low-Q antenna circuit. Such an implementation is still advantageous over conventional single frequency readers in detecting off-frequency tags because the scanning process hunts for the tags at multiple frequencies to find the frequency to which each particular tag is most responsive. Nonetheless, this implementation would result in less than optimal RF transmission strength at some of these frequencies which are removed from the peak resonant frequency of the antenna circuit. To overcome this, the auto-tuning sequence is extended to include a determination of the supplemental capacitance values needed to bring the antenna circuit to peak resonance at each of the frequencies to be scanned, i.e., at the center and side frequencies. For this purpose, the frequencies are stored as part of the auto-tune program instructions, and an auto-tune sequence is executed for each of the frequencies. The result of the complete tuning procedure at both center and side frequencies is a data table of capacitance values matched to each of the frequencies. This table is stored in processor memory and is addressed by the scanning program for maintaining the antenna resonance during the scanning sequence.

The frequency scanning sequence involves sequentially interrogating tags at each of the center and selected side frequencies rather than interrogating conventionally at a single reader operating frequency. A scan is performed at each of the frequencies. Each scan is carried out by synthesizing the particular frequency and closing the corresponding combination of switches recalled from the stored data table, waiting a brief period for the frequency to stabilize and listening for a response by an ID tag. If within a suitable listening window a tag response is verified by processor 12, the scanning sequence is halted until completion of the tag response. Tag response may be considered complete if no valid signal is received and decoded by processor 12 after a preset time interval. If no valid tag response is received within the allotted listening window, or after completion of a valid tag response, another scan is performed at the next frequency on the stored data table. During normal operation of the reader 10 successive scans are run continuously cycling through all of the side and center frequencies in the table, interrupted only by periodic retuning of the antenna circuit.

In the preferred form of this invention, the center frequency antenna calibration sequence is repeated periodically during operation of the reader, for example, every ten seconds, in order to compensate for changes in the reader's environment which might affect the tuning of the reader's antenna circuit. During recalibration the value of supplemental capacitance required during the last previous calibration is compared to the supplemental capacitance required by the current calibration. If these values are the same then it is concluded that no environmental changes have occurred affecting antenna tuning and the recalibration sequence ends at that point. If on the other hand it is found that the values of supplemental capacitance have changed, then the recalibration sequence continues to also retune for peak antenna resonance for each of the side frequencies to be scanned.

The recalibration sequence is executed in a very short time by processor 12, e.g. 10 milliseconds, and does not normally interfere with ID tag detection since tag presence in the reader's proximity field is normally much longer than the calibration time. As a result, the radiated signal strength of the reader at a desired operating frequency is substantially maximized notwithstanding changes in the reader environment, including relatively short term changes lasting only some seconds, such as persons or vehicles passing near the reader, as well as longer term changes such as weather variations.

During execution of the frequency scanning sequence, frequency scanning is achieved simply by sequentially switching each stored capacitance value into the antenna circuit by actuation of switches S1–S4, and setting the appropriate output frequency. The setting of the corresponding output frequency occurs very rapidly and does not introduce a significant delay in the scanning sequence. Typically each frequency is scanned in about 5–10 milliseconds. A complete frequency scan cycle over all selected frequencies is accomplished in a period of time much shorter than the typical presence time of an ID tag in the sensing field of the proximity reader, so that no ID tag readings will normally be lost due to the scanning process.

In the embodiment of FIG. 1 the digital processor 12 is called upon to synthesize the output frequency of the reader, to perform peak detection, and to carry out all other data processing associated with encoding the reader output in a conventional manner for interrogating the ID tags and decoding data from the tag responses. Because of the relatively heavy processing load, a high performance microprocessor is chosen for use as processor 12. A presently preferred device is a AT90S4414 RISK processor.

Figure 3:
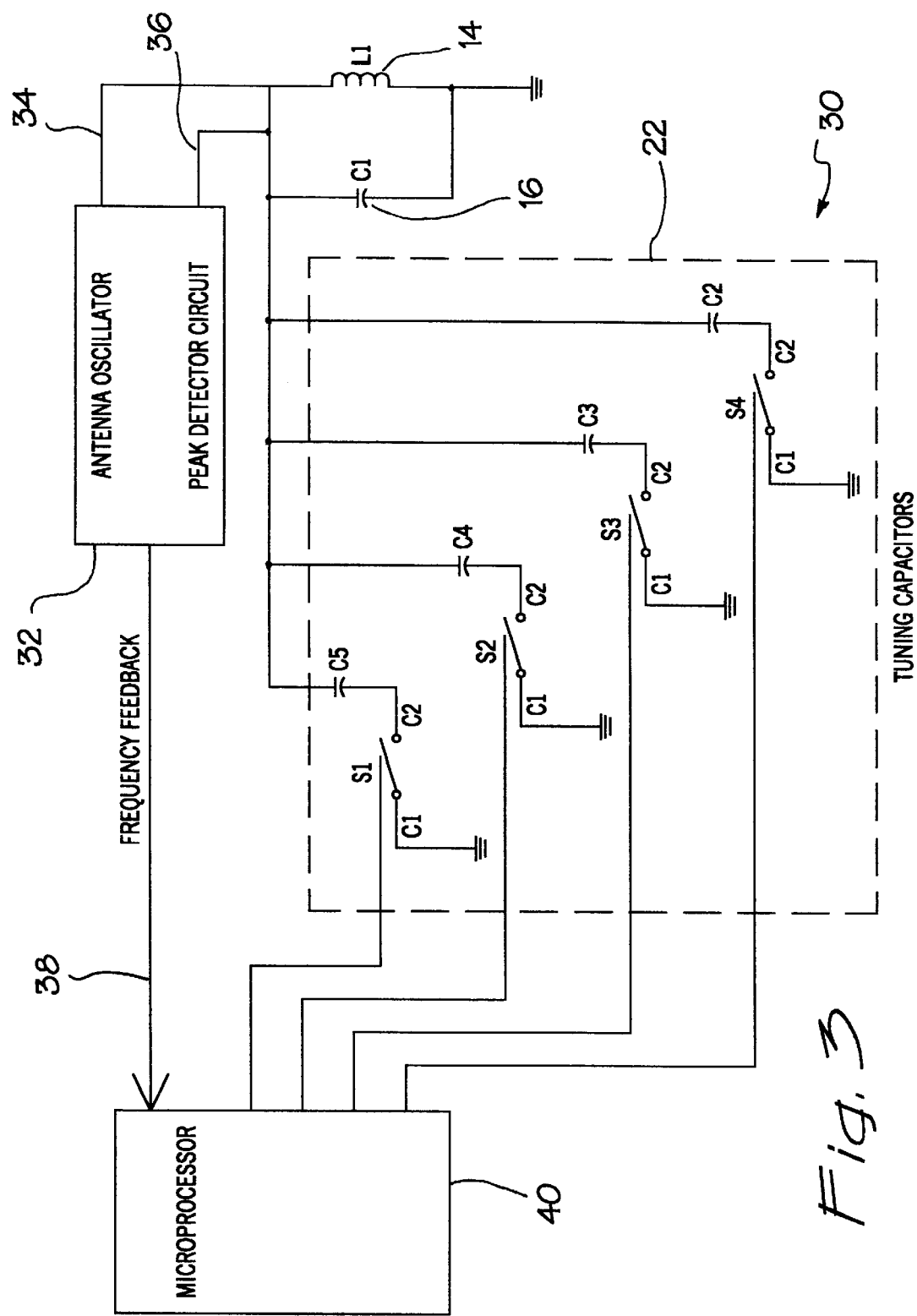
FIG. 3 is a block diagram showing a second design of the improved reader.

FIG. 3 is a block diagram of a second embodiment of this invention. Reader 30 takes advantage of a commercially available integrated circuit, TEMEC U2270. This IC combines a radio-frequency oscillator with a peak detector circuit, and automatically adjusts its output frequency to the peak resonant frequency of the antenna circuit. There is no external control over the frequency output and for this reason the frequency generator and peak detector are shown as a single block 32 in FIG. 3. IC 32 has an RF frequency output 34 connected for driving the antenna circuit, and an RF voltage sensing input 36 also connected to the antenna circuit for measuring the RF signal amplitude in the antenna tank circuit. IC 32 also has a frequency feedback line 38 connected to a timer of digital processor 40 measuring the output frequency of IC 32 by timing the output waveform edge to edge.

The use of IC 32 and in particular the TEMEC U2270 device is conventional in proximity readers, but in conventional readers the output frequency is initially set by the manufacturer, by adjusting a variable antenna coil or capacitor, to match the frequency to which the ID tags are tuned. Thereafter, however, the reader is subject to environmental influences which can cause it to drift off its initial frequency setting. For example, if the reader is mounted near a sizable metallic mass the resonant frequency of the antenna circuit is changed. This causes IC 32 to shift its output frequency to match the new resonant frequency of the antenna circuit, and the conventional reader continues to operate at this new frequency removed from the ID tag frequency. The result is markedly diminished reader sensitivity and poor system performance.

In the novel reader 30 of FIG. 3, on the other hand, processor 40 maintains positive control over the output frequency of IC 32. This is accomplished by measuring the output frequency as just explained, and forcing IC 32 to adjust its output frequency by controlling the peak resonant frequency of the antenna circuit. This last objective is achieved by adding an appropriate supplemental parallel capacitance to the antenna circuit by actuating switches S1–S4 of the capacitance ladder 22. As in the first described embodiment the antenna circuit is initially set to resonate at a higher frequency and supplemental capacitance is added by closing appropriate ones of switches S1–S4 until the peak resonance of the antenna circuit is shifted to the desired frequency. This will be detected by processor 40 measuring the frequency output of IC 32 which will follow the peak resonant frequency of the antenna circuit. That is, the output frequency of IC 32 is controlled indirectly by shifting the resonant frequency of the antenna circuit.

In this second embodiment of the invention both the antenna peak resonance and the output frequency can be set to a desired frequency simply by selecting a corresponding value of supplemental capacitance by means of switches S1–S4. Consequently, reader 30 is fully tuned to a particular frequency by closing the appropriate combination of these switches. Primary calibration of reader 30 involves finding the value of supplemental capacitance which will cause IC 32 to output the desired operating frequency of the reader, and this is done under control of suitable programming of processor 40. Similarly, the reader may be calibrated for a number of additional side frequencies to be scanned in order to hunt for off-frequency ID tags. Side frequency calibration is similar to the center frequency calibration. The supplemental capacitance values corresponding to each of these frequencies, in the form of switch addresses, is stored in a table for access by a scanning program which serves the same purpose as the frequency scanning program described in connection with the first embodiment. The frequency scanning program in this second embodiment is essentially as described in connection with the first embodiment above, except that the frequencies are set simply by setting switches S1–S4 according to the stored table and no other frequency data needs to be stored.

In this embodiment much of the RF frequency generation and processing is handled by IC 32 allowing the choice of a less powerful microprocessor device for use as processor 40. A currently preferred microprocessor is an ATMEL 89C55 device, which is a variant of the 8051 microprocessor. Other closely related variants of the same device are available from several other semiconductor manufacturers.

The detailed implementation of the antenna circuit autotune and frequency scanning programs in either of the two described embodiments can vary considerably while still achieving the aims set forth above. No detailed program information or listing is necessary here since such programming does not require more than ordinary skill possessed by persons competent in and familiar with the conventional programming of microprocessors used in existing proximity reader systems.

Particular embodiments of the invention have been described and illustrated for purposes of clarity and example only. Many changes, substitutions and modifications to the described embodiments will become apparent to those having no more than ordinary skill in the art without thereby departing from the scope of this invention as defined by the following claims.

What is claimed is:

1. A proximity reader for a radio frequency identification system wherein identification tags have transponder circuits powered by a radio frequency transmission of the reader at a resonant frequency of the tags for inducing a coded response, the reader having frequency generator means for generating a center frequency and a plurality of discrete side frequencies spaced from each other and from said center frequency, an antenna circuit connected for radiating each of said center frequency and said side frequencies in a sequence to interrogate transponder tags, and a microprocessor connected to said antenna circuit for receiving and decoding transponder tag information communicated by loading down a radiofrequency field radiated by said antenna circuit at any single one of said center and side frequencies, antenna resonance tuning means including a selectable impedance in said antenna circuit and tuner program means operative in step with said sequence for selecting discrete values of said impedance corresponding to each of said center frequency and said discrete side frequencies to substantially optimize the reactance of said antenna circuit for maximum radiated signal at each of said center frequency and side frequencies thereby to maximize operative range of the transmitter and for storing said values for reference by said tuner program means.

2. The reader of claim 1 wherein said selectable impedance is a plurality of capacitances addressable by said microprocessor, and said impedance values are stored as a table of addresses representative of said capacitances.

3. The reader of claim 2 wherein said capacitances are binarily weighed.

4. The reader of claim 1 wherein said tuner program means are executed upon initial power-up of the reader to compensate for environmental impact on the resonance of the antenna circuit.

5. The reader of claim 4 wherein said tuner program means are executed at periodic intervals during operation of the reader so that the antenna circuit reactance is retuned to compensate for changes in environmental impact on the resonance of the antenna circuit during operation of the reader.

6. The reader of claim 1 further comprising scanning program means operative for executing a scanning sequence including sequentially switching said frequency generator through each of said side and center frequencies thereby to improve interrogation range of off-frequency transponder tags.

7. The reader of claim 6 wherein said scanning program means are further operative for interrupting said scanning sequence upon detection by said microprocessor of a response from a transponder tag and for resuming said scanning sequence upon completion of said response.

8. The reader of claim 1 wherein said antenna resonance tuning means comprises a peak detector circuit connected for measuring a radiofrequency voltage across said antenna circuit and providing a peak detector output to said microprocessor, and said microprocessor is operative for modifying an output frequency of said generator to obtain a peak resonance of the antenna circuit, and said tuner program means is operative for selecting a value of said impedance effective for bringing said output frequency to a desired frequency such that the reactance of said antenna circuit is optimized at said desired frequency.

9. The reader of claim 8 wherein said microprocessor and said tuner program means are operative for measuring said output frequency and for storing a value of said impedance associated with said desired frequency.

10. The reader of claim 9 wherein said desired frequency includes a plurality of spaced apart discrete frequencies, and said tuner program means is operative for storing a table of impedance values corresponding to said plurality of discrete frequencies.

11. The reader of claim 10 wherein said plurality of frequencies comprises said center frequency and said side frequencies.

12. The reader of claim 8 wherein said frequency generator is exterior to said microprocessor and includes said peak detector circuit on a common integrated circuit device.

13. The reader of claim 1 wherein said frequency generator is internal to said microprocessor and comprises a crystal controlled clock and a clock frequency divider controlled by said tuner program means for setting said center frequency and said side frequencies.

14. A proximity reader for a radio frequency identification system, the reader having frequency generator means for generating an output frequency, an antenna circuit connected for radiating a radiofrequency field at said output frequency for a time period sufficient to receive and decode a transponder tag coded response communicated by loading down said radiofrequency field at said output frequency, a microprocessor connected to said antenna circuit for receiving and decoding transponder tag information, scanner program means operative for sequentially switching said output frequency through a plurality of discrete frequencies spaced apart from each other and waiting for a predetermined listening time at each of said discrete frequencies sufficient to receive and verify a transponder tag response at said each of said discrete frequencies, thereby to improve interrogation of transponder tags built to relatively loose frequency tolerances.

15. The proximity reader of claim 14 further comprising antenna resonance tuning means including a selectable impedance in said antenna circuit and tuner program means operative for selecting and storing values of said impedance at each of said plurality of frequencies, and means for connecting each selected impedance values to said antenna circuit at a corresponding one of said output frequencies thereby to substantially optimize the reactance of said antenna circuit and maximize operational range of the transmitter at each of said discrete frequencies.

16. A proximity reader for a radio frequency identification system, the reader having frequency generator means for generating a center frequency and a plurality of discrete side frequencies spaced from each other, an antenna circuit connected for radiating said center frequency and said side frequencies to interrogate transponder tags, and a microprocessor connected to said antenna circuit for receiving and decoding transponder tag information, an addressable variable tuning capacitance in said antenna circuit and tuner program means operative for addressing said tuning capacitance and electrically connected to said antenna for detecting a radio frequency signal amplitude in said antenna circuit at different capacitance values of said capacitance thereby to build a table of addresses representative of capacitance values yielding an optimum signal amplitude at each of said center frequency and discrete side frequencies, thereby to optimize the operative range of the reader.

17. The reader of claim 16 further comprising a peak detector circuit connected for measuring a radiofrequency voltage across said antenna circuit and providing a peak detector output to said microprocessor, and said microprocessor is operative for modifying an output frequency of said generator to obtain a peak resonance of the antenna circuit, and wherein said tuner program means is operative for selecting a value of said tuning capacitance effective for bringing said output frequency to one of the center and side frequencies such that the reactance of said antenna circuit is optimized at said frequencies.

18. The reader of claim 17 wherein said microprocessor and said tuner program means are operative for timing cycles of said output frequency thereby to measure the output frequency, and for storing a table of values of said tuning capacitance associated with an output frequency equal to each of the center and side frequencies.

19. The reader of claim 18 further comprising scanning program means operative for executing a scanning sequence comprising sequentially switching said frequency generator through each of said side and center frequencies thereby to improve interrogation range of off-frequency transponder tags.

* * * * *